United States Patent [19]
Trisnadi et al.

[11] Patent Number: 5,638,193
[45] Date of Patent: Jun. 10, 1997

[54] METHOD AND APPARATUS FOR AZIMUTHAL MULTIPLEXING OF HOLOGRAMS

[75] Inventors: Jahja I. Trisnadi, Austin, Tex.; Curtis A. Shuman, Colorado Springs, Colo.

[73] Assignee: Tamarack Storage Devices, Inc., Austin, Tex.

[21] Appl. No.: 361,147

[22] Filed: Dec. 21, 1994

[51] Int. Cl.$^6$ .............................. G02B 5/32; G03H 1/10; G03H 1/12; G11B 7/00
[52] U.S. Cl. .................. 359/11; 359/10; 359/21; 359/15; 369/103
[58] Field of Search .................. 359/3, 10, 11, 359/15, 30, 21, 29; 369/103, 102, 112

[56] References Cited

U.S. PATENT DOCUMENTS

| | | | |
|---|---|---|---|
| 3,848,096 | 11/1974 | Marko | 359/11 |
| 4,988,153 | 1/1991 | Paek | 359/15 |
| 5,477,347 | 12/1995 | Redfield et al. | 359/3 |
| 5,483,365 | 1/1996 | Pu et al. | 359/11 |
| 5,510,912 | 4/1996 | Blaum et al. | 359/21 |

FOREIGN PATENT DOCUMENTS

| | | | |
|---|---|---|---|
| 632348A1 | 1/1995 | Japan | 359/10 |

OTHER PUBLICATIONS

K. Curtis, A. Pu, and D. Psaltis, "*Method for Holographic Storage Using Peristrophic Multiplexing,*"Optics Letters, vol. 19, No. 13, Copyright 1994, pp. 993–994.

*Primary Examiner*—Paul M. Dzierzynski
*Assistant Examiner*—Audrey Chang
*Attorney, Agent, or Firm*—Baker & Botts, L.L.P

[57] ABSTRACT

A holographic storage system and method are provided in which a light source (12) is used to generate a coherent light beam which is split into a reference beam (18) and an object beam (20). The reference beam (18) is directed to the holographic storage medium (22) through use of a reference beam multiplexer (24). The object beam is encoded with a pattern encoder (34) and directed to the holographic storage medium (26). During read out, the object beam is reconstructed and detected by an optical detector (40).

17 Claims, 3 Drawing Sheets

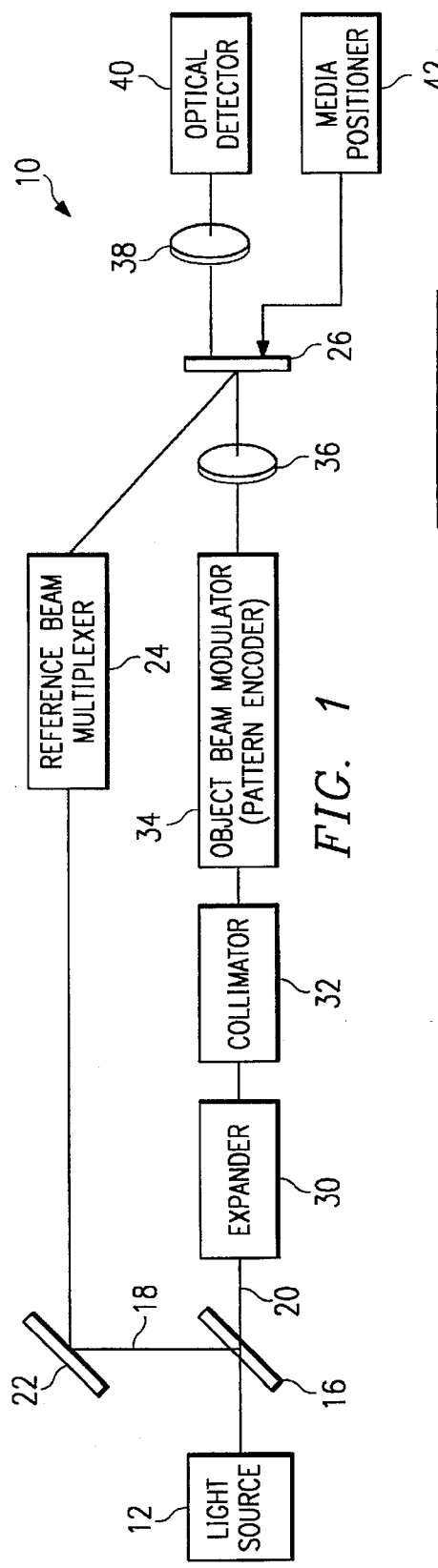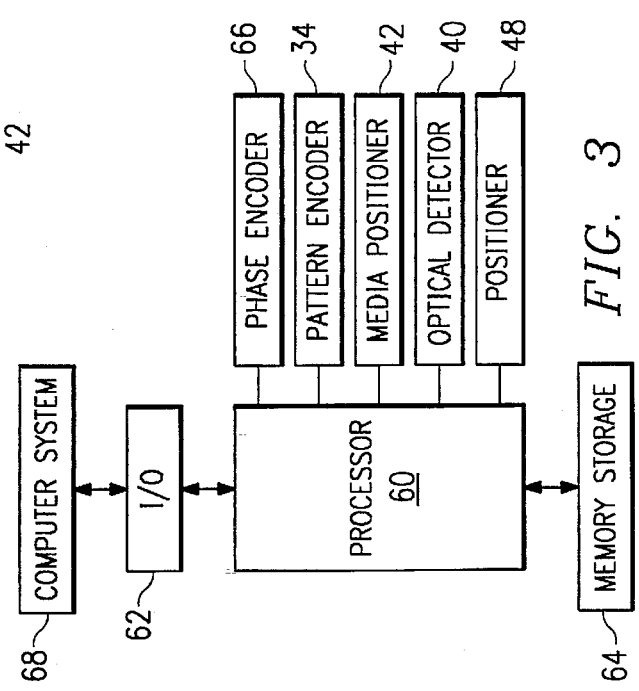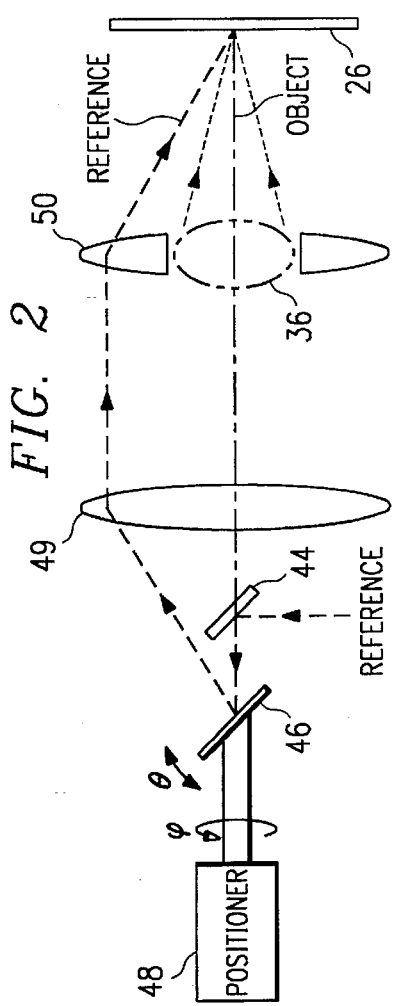

METHOD AND APPARATUS FOR AZIMUTHAL MULTIPLEXING OF HOLOGRAMS

TECHNICAL FIELD OF THE INVENTION

This invention relates generally to optical storage, and more particularly to a method and apparatus for azimuthal multiplexing of holograms.

BACKGROUND OF THE INVENTION

In the field of computer systems, significant advances have been made in recent years in providing affordable mass storage with increased storage capacity and decreased access time. Much of this effort has been directed at rotating magnetic medium, such as that found in hard disk drives. Unfortunately, access times with magnetic medium remain long, in the millisecond range.

In an effort to decrease access times and increase storage capacity, holographic storage systems have been developed. Examples of such holographic storage systems are described in U.S. Pat. No. 4,927,220, entitled "SYSTEM AND METHOD FOR PHOTO-REFRACTIVE HOLOGRAPHIC RECORDING AND SIGNAL PROCESSING", issued on May 22, 1990. That reference is herein incorporated by reference.

Holographic storage systems offer significant advantages over conventional mass storage systems. For example, the access time with holographic storage systems is on the order of microseconds. Furthermore, holographic storage systems retrieve arrays of data bits in parallel, rather than serially. For example, an array of 1,000 bits by 1,000 bits can be retrieved at once.

Normally, the dynamic range of the holographic storage medium is larger than that needed to store a single hologram with an acceptable signal-to-noise ratio. Therefore it is desirable to multiplex a number of holograms at one location to achieve higher storage capacity. One technique for multiplexing is referred to as planar (or θ) angular multiplexing, in which different holograms are stored at the same location by changing the relative planar angle of the reference beam, object beam, or the medium (the planar angle θ is the angle that measures rotation in the incident plane). Planar angular encoding is attractive because of its relative ease of implementation. In principle, beam deflecting systems or rotational stages can be used to accomplish planar angular multiplexing. To reduce complexity, however, usually the incident angle of only the reference beam is changed.

To prevent cross talk between holograms stored at the same location, each reference beam should be separated by the Bragg selectivity angle. The Bragg selectivity angle of the recording medium is a function of the thickness of the recording medium, among other things. In particular, the Bragg selectivity angle decreases as the thickness of the storage medium increases.

Therefore, the number of holograms that can be multiplexed using angle encoding depends on the Bragg selectivity angle, and on the ability of the system to change the angles of the reference or object beams. For example, for a system with an average Bragg selectivity angle of 1°, and an optical system allowing 30° of reference beam swing, only 30 different reference beam angles are available. This limits the number of holograms that can be multiplexed using planar angular multiplexing alone.

Therefore, a need has arisen for a method and apparatus that will allow for greater use of the dynamic range of the medium by greater multiplexing of holograms.

SUMMARY OF THE INVENTION

In accordance with the teachings of the present invention, a method and an apparatus for azimuthal multiplexing of holograms are provided which substantially eliminate or reduce disadvantages and problems associated with prior art holographic storage systems.

In particular, a holographic storage system is provided in which a storage medium having a face is operable to store holographic images at sites. A coherent light source generates light for a reference beam and an object beam. A pattern encoder imposes data patterns on the object beam. Reference beam optics are operable to rotate the reference beam about an axis substantially normal to the face of the storage medium at a site being addressed and to direct the reference beam to the site being addressed. Object beam optics are provided which direct the object beam to the site being addressed. A control system is provided which controls the reference beam optics such that holograms are multiplexed at the site being addressed by rotating the reference beam to different positions.

In a particular embodiment, the reference beam optics are operable to rotate the reference beam about an axis of the object beam. In another particular embodiment, the reference beam optics comprise a rotational mirror. Coupled to the rotational mirror is a positioner which rotates the mirror about an axis substantially normal to the face of the storage medium. Also provided in this embodiment are lenses which direct the reference beam from the rotational mirror to the site being addressed.

Also provided is a method of mutliplexing holograms at site on a holographic storage medium having a face, in which a reference beam and an object beam are generated. Data patterns are imposed on the object beam, and the reference beam is rotated to different positions for multiplexing the holograms, the reference beam being rotated about an axis normal to the face of the holographic storage medium at the site. Also, the reference beam and object beam are directed to the site.

An important technical advantage of the present invention is the fact that the dynamic range of a holographic storage medium is more fully taken advantage of through azimuthal multiplexing. With azimuthal multiplexing, the relative angle of the reference beam to a stack site is rotated about an axis normal to the storage medium at the stack site.

Another important advantage of the present invention is the fact that it combines azimuthal multiplexing with other forms of multiplexing, such as planar angular multiplexing and multiplexing through the use of phase patterns imposed on the reference beam.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 1 is a block diagram of a holographic storage system constructed according to the teachings of the present invention;

FIG. 2 illustrates a particular embodiment of a reference beam multiplexer according to the teachings of the present invention;

FIG. 3 is a block diagram of a control system for a holographic storage system according to the teachings of the present invention;

DETAILED DESCRIPTION OF THE INVENTION

Figure 4:
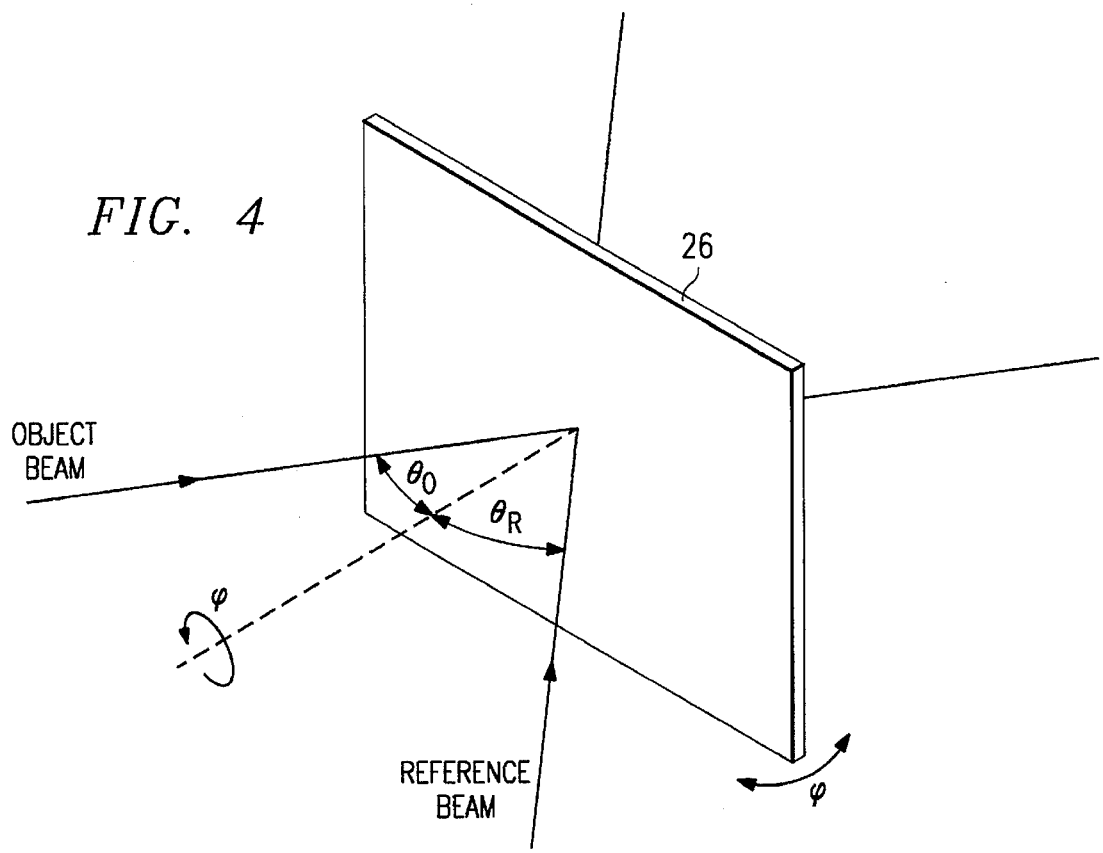
FIG. 4 illustrates relevant incident angles on holographic storage medium.

FIG. 1 illustrates a particular embodiment of a holographic storage system 10 according to the teachings of the present invention. As shown in FIG. 1, the holographic storage system 10 of the present invention may be constructed using discrete optical components, such as lenses and mirrors.

As shown in FIG. 1, holographic storage system 10 includes a light source 12, which may comprise a laser light source. As will be discussed, the light from the light source 12 will be split into a reference beam and an object beam. The reference beam and object beam will be directed to a holographic storage medium to record and recall holographic information. The holographic information may be of most any kind, such as that used in digital computers, or, as another example, cartoons or images. In computer systems, each hologram is referred to as a "page," and typically comprises an array of data bits. Several pages will be stored at one location on the holographic storage medium, referred to as a stack site. A stack site corresponds to a particular row and column on the holographic storage medium.

Light generated by light source 12 is directed to a beam splitter 16 which splits the light from light source 12 into a reference beam 18 and an object beam 20. Reference beam 18 is reflected by a mirror 22 to a reference beam multiplexer 24. As will be discussed below, the multiplexer 24 controls the angle at which the reference beam 18 is directed to holographic storage medium 26. Reference beam multiplexer 24 allows for azimuthal multiplexing of holograms, and may combine azimuthal multiplexing with planar or phase encoding. Thus, multiplexer 24 may include a phase encoder or the ability to control the planar angle of the reference beam, or both, along with the ability to control the azimuthal angle of the reference beam.

As discussed above, beam splitter 16 also produces object beam 20, which is encoded and directed with various object beam optics. Following is a description of an exemplary embodiment for encoding and directing the object beam, although other schemes may be used without departing from the intended scope herein.

Object beam 20 is expanded by an expander 30 and collimated by collimator 32. Expander 30 may be a stack lens array. Collimator 32 may be a collimation lens. A data pattern is then imposed on the object beam 20 by a pattern encoder 34. Pattern encoder 34 may be a spatial light modulator ("SLM"), or any device capable of encoding the object beam, such as a fixed mask, or other page composer. Such pattern encoding is typically amplitude encoding. The pattern encoder 34 receives digitized data from a control system, to be discussed, and imposes that pattern onto the object beam 20, such that the object beam 20 comprises an array of dark and light spots. The encoded object beam 20 is then focused by a transform lens 36 to a particular stack site on holographic storage medium 26. Transform lens 36 forms the Fourier transform of the page, and directs that transformed image to holographic storage medium 26. By using the Fourier transform, a smaller recording size is achieved, and some immunity to materials defects is provided.

Upon a recall operation, object beam 20 is blocked from transmission, such as by a shutter or through the use of pattern encoder 34, for example. As reference beam 18 intersects holographic storage medium 26, the stored page is reconstructed and transmitted towards imaging optics 38, which may be an inverse Fourier transform lens. Imaging optics 38 directs and images the reconstructed object beam 20 onto an optical detector 40, which in a particular example is a charge coupled device ("CCD") array. The optical detector 40 may also comprise a conventional photodiode array or other suitable detector array that transforms the encoded page into digitized data for use by a control system, to be discussed.

Also shown in FIG. 1 is media positioner 42. Media positioner 42 is used to position the holographic storage medium 26. In particular, media positioner 42 may be used to rotate holographic storage medium 26 about an axis normal to the holographic storage medium at the desired stack site (the $\phi$ direction, such as with a rotational stage, to allow for azimuthal multiplexing. Similarly, media positioner 72 may be used to rotate the media in the $\theta$ direction for planar angular multiplexing. By rotating holographic storage medium 26 in the $\phi$ direction, a plurality of holograms can be azimuthally multiplexed at one stack site.

Furthermore, media positioner 42 can translationally move holographic storage medium 26 (e.g., in the X and Y directions) so as to allow different stack sites to be addressed. Media positioner 42 may include a controllable stepper motor, for example, to drive the positioning of the media. Although positioner 42 may be used to rotate medium 26 for azimuthal multiplexing, the appropriate rotation may be achieved by rotating the reference or object beams, alone or in conjunction with rotation of the media. FIG. 2 provides a particular embodiment of multiplexer 24 which allows for rotation of the reference beam in the $\phi$ direction with various reference beam optics, for azimuthal multiplexing. FIG. 2 also shows rotation of the reference beam in the $\theta$ direction for planar angular multiplexing. The particular embodiment of reference beam optics shown in FIG. 2 is exemplary only, and other schemes may be used without departing from the intended scope herein.

As shown in FIG. 2, the reference beam 18 is directed to fixed mirror 44, which reflects the beam to a rotational mirror 46. Fixed mirror 44 may be the same mirror as mirror 22 of FIG. 1, and need not be included, with the reference beam directed directly to the rotational mirror 46. Rotational mirror 46 provides azimuthal rotation of the reference beam relative to the recording medium (the $\phi$ direction). Mirror 46 may also be rotated in the $\theta$ direction for planar angular multiplexing as well, although such multiplexing is not required. Rotational mirror 46 is rotated under control of positioner 48. Positioner 48 may include a stepper motor and rotational stage to drive rotational mirror 46 in the $\phi$ and $\theta$ directions, although any mechanism or method may be used to rotate mirror 46. The reference beam is reflected from mirror 46 to lens 49. Lens 49 has focal length $f_1$, and may be positioned a distance $f_1$ from mirror 46. The reference beam is then directed to lens 50, which has focal length $f_2$. Lens 50 may be positioned a distance $f_1+f_2$ from lens 49. Lens 50 directs the reference beam to medium 26, and may be positioned a distance $f_2$ from the stack site being addressed. Lens 50 may be the same lens as lens 36 of FIG. 1, or may be a separate lens. Furthermore, lens 50 may be concentrically disposed around lens 36. Thus, in a particular embodiment, the reference beam can be rotated about the axis of the object beam. Additional mirrors may be used to orient the object beam as shown in FIG. 2.

As discussed above, the reference beam may also be phase encoded, for example with orthogonal phase codes, to allow for combining phase multiplexing with azimuthal or planar angular multiplexing. Such phase coding may be accomplished, for example, in a particular embodiment, by expanding and collimating the reference beam after performing the $\phi$ rotation, and then performing phase encoding with a combination SLM and polarizer. The reference beam is then directed to the storage medium.

The embodiments discussed herein include descriptions of particular optical elements, some being reflective and some being refractive. It should be understood that these choices are exemplary, and other arrangements may be used, with different reflective or refractive components, and with the described reflective components replaced with refractive components, and vice versa. Furthermore, any other optical elements may be used, such as holographic optical elements, among others.

It should also be understood that any suitable apparatus or method for rotating the reference beam relative to the holographic storage medium 26 may be used without departing from the intended scope of the present invention.

FIG. 3 illustrates a block diagram of a control system for controlling the holographic storage system 10 shown in FIG. 1. As shown in FIG. 3, a processor 60 is coupled to I/O 62 and memory/storage 64. Processor 60 is operable to process instructions and store and retrieve data from memory/storage 64. Processor 60 may also be controlled through I/O 62. As shown in FIG. 3, processor 60 is also coupled to object beam modulator (pattern encoder) 34, positioner 42, optical detector 40, positioner 48, and to a phase encoder 66 (discussed above in connection with reference beam multiplexer 24).

In operation, processor 60 controls the holographic storage system 10 so as to allow recording and recall of data stored at particular stack sites. For example, holographic storage system 10 may be included as part of a larger computer system 68 as shown in FIG. 3, and used for mass storage. Computer system 68 requests processor 60 to store data or retrieve data stored within holographic storage medium 26. Processor 60, by executing instructions stored in memory/storage 64, then controls the holographic storage system 10 to perform the requested operation and accordingly responds to computer system 68 through I/O 62.

FIG. 4 illustrates a particular example of the present invention in which the object beam and reference beam are directed to holographic storage medium 26 at angles $\theta_O$ and $\theta_R$. $\theta_O$ and $\theta_R$ are measured in relation to a reference normal to the surface of holographic storage medium 26 at the stack site. The azimuthal multiplexing of the present invention is accomplished by azimuthally rotating the reference beam relative to the medium 26 about an axis normal to the medium 26 at the stack site, as indicated by the angle $\phi$. The amount of rotation needed for azimuthal multiplexing will be discussed below. It should be understood that the azimuthal rotation is relative, and thus the storage medium 26 may be rotated, while leaving the reference (and/or object) beam stationary, or both the beams and holographic storage medium 26 can be rotated, or the beam or beams alone.

Figure 5:
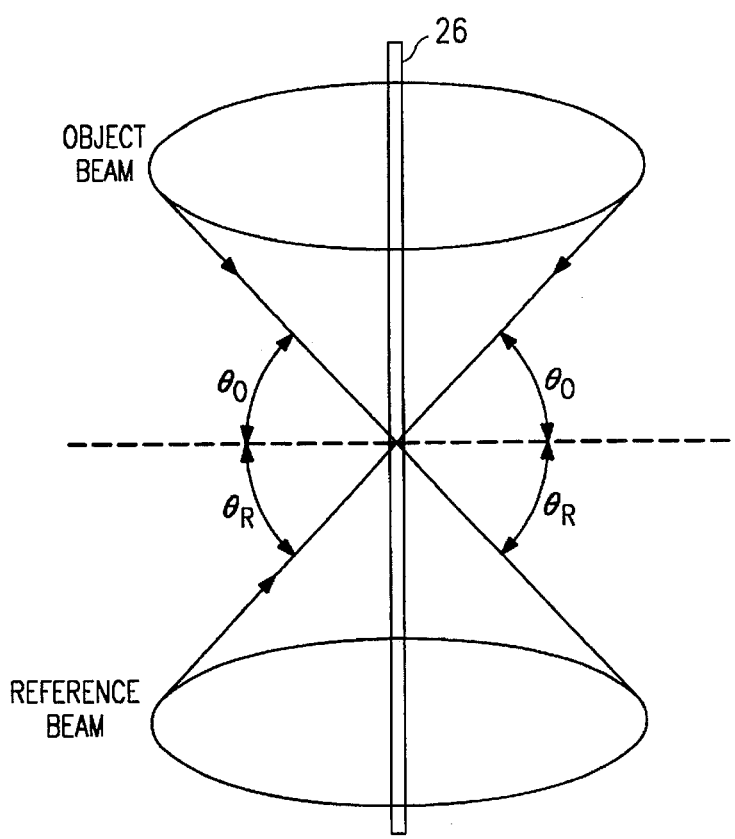
FIG. 5 illustrates a top view of object beam and reference beam incident angles, and occupied K-space cones.

As shown in FIG. 5, storage of a particular hologram results in occupation of a cone in the K-space. K represents the grating vector of the grating that results from the interference of the reference and object beams.

Figure 6:
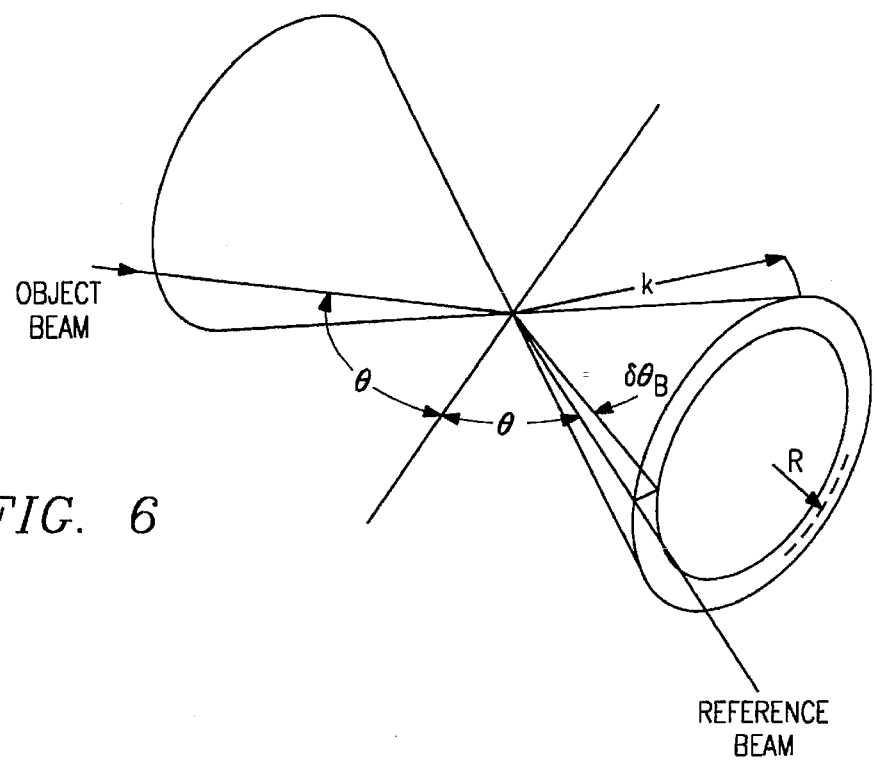
FIG. 6 illustrates an isometric view of incident object beam and reference beam angles, and occupied K-space cones.

As shown in FIG. 6, each cone will have a thickness defined by the Bragg selectivity angle of the system. In particular, a stored hologram can be recalled by any reference beam having an angle within one Bragg selectivity angle of the nominal reference beam angle. Any two holograms can be independently recalled if their reference beams do not fall in the volume of intersection between their cones.

As also shown in FIG. 6, the magnitude of the K-vector (i.e., the segment joining the base of the cone and its vertex) is equal to k, which is the spatial frequency of the light used for the reference beam. Also in FIG. 6, for simplicity, we consider the case where $$\theta_O = \theta_R = \theta. \tag{1}$$

Figure 7:
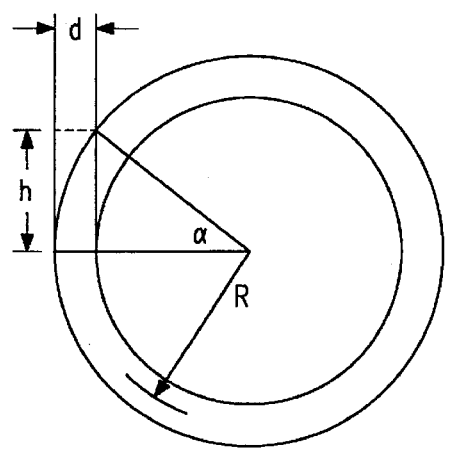
FIG. 7 illustrates a side view of an occupied K-space cone.
Figure 8:
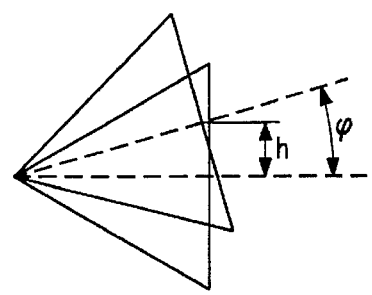
FIG. 8 illustrates azimuthal rotation of a K-space cone according to the teachings of the present invention.

As shown in FIGS. 7 and 8, the angle $\phi$ through which the storage medium (or object or reference beams) must be rotated for azimuthal multiplexing can be approximated by $$\phi \cong \sqrt{2 \delta\theta_B \times \cos\theta}, \tag{2}$$

wherein $\delta\theta_B$ is the Bragg selectivity angle.

Thus, the number of holograms that can be recorded by pure azimuthal angular multiplexing at a single recording location is $$N_\phi = \frac{\pi}{\phi} = \frac{\pi}{\sqrt{\delta\theta_B + 2\cos\theta_O}}. \tag{3}$$

Furthermore, when combined with normal planar angular multiplexing, the angular thickness of the cone stack becomes approximately (for small $\theta$)

$$\text{Angular Thickness} = N_\theta \delta\theta_B \tag{4}$$

and thus $$N_\phi = \frac{\pi}{\sqrt{N_\theta \delta\theta_B \times 2\cos\theta_O}}. \tag{5}$$

Therefore, the total number of holograms for the combined azimuthal and planar angular multiplexing is $$N = N_\theta N_\phi = \frac{\pi \sqrt{N_\theta}}{\sqrt{\delta\theta_B \times 2\cos\theta_O}}. \tag{6}$$

Although the present invention has been described in detail it should be understood that various changes, substitutions, and alterations can be made without departing from the spirit and scope of the invention as defined by the appended claims.

What is claimed is:

1. A holographic storage system, comprising:
   a storage medium having a face and operable to store holographic images at sites;
   a coherent light source operable to generate light for a reference beam and an object beam;
   a pattern encoder for imposing data patterns on the object beam;
   a phase encoder for imposing phase patterns on the reference beam;
   reference beam optics operable to rotate the reference beam about an axis substantially normal to the face of the storage medium at a site being addressed and to direct the reference beam to the site being addressed;
   object beam optics operable to direct the object beam to the site being addressed; and
   a control system operable to control the reference beam optics, the pattern encoder, and the phase encoder to selectively 1) impose data patterns on the object beam and rotate the reference beam or 2) impose phase patterns on the reference beam and rotate the reference beam or 3) impose data patterns on the object beam, impose phase patterns on the reference beam, and rotate the reference beam, such that holograms are multiplexed at the site being addressed by rotating the reference beam to different positions.

2. The system of claim 1, wherein the reference beam optics are operable to rotate the reference beam about the axis of the object beam.

3. The system of claim 1, wherein the reference beam optics comprise:
   a rotational mirror;

a positioner coupled to the rotational mirror and operable to rotate the mirror about an axis substantially normal to the face of the storage medium; and lenses operable to direct the reference beam from the rotational mirror to the site being addressed.

4. The system of claim 3, wherein the positioner is further operable to rotate the mirror about an axis substantially parallel to the face of the storage medium, such that holograms are further multiplexed at the site being addressed with planar angular multiplexing.

5. The system of claim 1, and further comprising a positioner coupled to the storage medium and operable to rotate the storage medium about axes normal to the face of the storage medium at the sites.

6. The system of claim 1, wherein each of the positions to which the reference beam is rotated are separated by at least an approximate angle φ, measured about the axis normal to the face of the storage medium at the site being addressed, where $$\phi \cong \sqrt{2\, \delta\theta_B \times \cos\theta}$$

wherein $\delta\theta_B$ is the Bragg selectivity angle of the storage medium, and $\theta$ is the angle of the reference beam measured from the axis normal to the face of the storage medium at the site being addressed.

7. The system of claim 1, and further comprising an optical detector operable to detect a reconstructed object beam.

8. A holographic storage system, comprising:

a storage medium having a face and operable to store holographic images at sites;

a coherent light source operable to generate light for a reference beam and an object beam;

a pattern encoder for imposing data patterns on the object beam;

a rotational mirror to which the reference beam is directed;

a positioner coupled to the rotational mirror and operable to rotate the mirror about an axis substantially normal to the face of the storage medium and about an axis substantially parallel to the face of the storage medium;

a phase encoder for imposing phase patterns of the reference beam;

reference beam optics operable to direct the reference beam from the rotational mirror to the site being addressed;

object beam optics operable to direct the object beam to the site being addressed; and a control system operable to control the positioner, the pattern encoder, and the phase encoder, to selectively 1) impose data patterns on the object beam and rotate the reference beam or 2) impose phase patterns on the reference beam and rotate the reference beam or 3) impose data patterns on the object beam, impose phase patterns on the reference beam, and rotate the reference beam, such that holograms are multiplexed at the site being addressed.

9. The system of claim 8, wherein the rotational mirror and reference beam optics are operable to rotate the reference beam about the axis of the object beam.

10. The system of claim 8, and further comprising a positioner coupled to the storage medium and operable to rotate the storage medium about axes normal to the face of the storage medium at the sites.

11. The system of claim 8, wherein each of the positions to which the reference beam is rotated about the axis normal to the face of the storage medium are separated by at least an approximate angle φ, measured about the axis normal to the face of the storage medium at the site being addressed, where $$\phi \cong \sqrt{2\, \delta\theta_B \times \cos\theta}$$

wherein $\delta\theta_B$ is the Bragg selectivity angle of the storage medium, and $\theta$ is the angle of the reference beam measured from the axis normal to the face of the storage medium at the site being addressed.

12. A method of multiplexing holograms at a site on a holographic storage medium having a face, comprising:

generating a reference beam and an object beam;

selectively 1) imposing data patterns on the object beam and rotating the reference beam about an axis normal to the face of the holographic storage medium at the site or 2) imposing phase patterns on the reference beam and rotating the reference beam about an axis normal to the face of the holographic Storage medium at the site or 3) imposing data patterns on the object beam, imposing phase patterns on the reference beam, and rotating the reference beam about an axis normal to the face of the holographic storage medium at the site; and directing the reference beam and the object beam to the site.

13. The method of claim 12, wherein the reference beam is rotated about the axis of the object beam.

14. The method of claim 12, wherein rotating comprises:

directing the reference beam to a mirror;

rotating the mirror about an axis substantially normal to the face of the storage medium; and directing the reference beam from the mirror to the site.

15. The method of claim 14, and further comprising rotating the mirror about an axis substantially parallel to the face of the storage medium, such that holograms are further multiplexed with planar angular multiplexing.

16. The method of claim 12, and further comprising rotating the storage medium about the axis normal to the face of the holographic storage medium at the site.

17. The method of claim 12, wherein each of the positions to which the reference beam is rotated are separated by at least an approximate angle φ, measured about the axis normal to the face of the storage medium at the site, where $$\phi \cong \sqrt{2\, \delta\theta_B \times \cos\theta}$$

wherein $\delta\theta_B$ is the Bragg selectivity angle of the storage medium, and $\theta$ is the angle of the reference beam measured from the axis normal to the face of the storage medium at the site.

* * * * *